(12) United States Patent
Yang et al.

(10) Patent No.: US 9,112,105 B1
(45) Date of Patent: Aug. 18, 2015

(54) NITRIDE SEMICONDUCTOR LIGHT EMITTING DEVICE

(71) Applicant: SAMSUNG ELECTRONICS CO., LTD., Suwon-Si, Gyeonggi-do (KR)

(72) Inventors: Jung Seung Yang, Seongnam-si (KR); Seong Joon Cho, Osan-si (KR); Bun Joon Kim, Seoul (KR); Dong Gyu Shin, Seoul (KR); Hyun Wook Shim, Suwon-si (KR); Suk Ho Yoon, Seoul (KR)

(73) Assignee: SAMSUNG ELECTRONICS CO., LTD., Suwon-Si, Gyeonggi-do (KR)

( * ) Notice: Subject to any disclaimer, the term of this patent is extended or adjusted under 35 U.S.C. 154(b) by 0 days.

(21) Appl. No.: 14/540,969

(22) Filed: Nov. 13, 2014

(30) Foreign Application Priority Data

Feb. 4, 2014 (KR) .......................... 10-2014-0012538

(51) Int. Cl.
| | |
|---|---|
| *H01L 31/00* | (2006.01) |
| *H01L 33/24* | (2010.01) |
| *H01L 33/00* | (2010.01) |
| *H01L 33/06* | (2010.01) |
| *H01L 33/32* | (2010.01) |
| *H01L 33/12* | (2010.01) |

(52) U.S. Cl.
CPC ............ *H01L 33/24* (2013.01); *H01L 33/0025* (2013.01); *H01L 33/06* (2013.01); *H01L 33/12* (2013.01); *H01L 33/32* (2013.01)

(58) Field of Classification Search
CPC .................. H01L 2924/00; H01L 2924/0002; H01L 33/007; H01L 33/32; H01L 21/02458; H01L 21/0254; H01L 21/0262; H01L 33/025; H01L 33/22; H01L 33/06; H01L 33/325; H01L 21/02494; H01L 21/02579; H01L 21/02
USPC .......... 438/22, 27–28, 46; 257/13, 88, 94, 97, 257/660, E21.599, E33.006
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |
| RE38,466 | E | 3/2004 | Inoue et al. |
| 6,818,465 | B2 | 11/2004 | Biwa et al. |
| 6,818,530 | B2 | 11/2004 | Shimoda et al. |

(Continued)

FOREIGN PATENT DOCUMENTS

| | | |
|---|---|---|
| JP | 2013-120774 A | 6/2013 |
| KR | 10-2010-0054589 A | 5/2010 |

(Continued)

*Primary Examiner* — Mark A Laurenzi
(74) *Attorney, Agent, or Firm* — McDermott Will & Emery LLP

(57) ABSTRACT

The nitride semiconductor light emitting device includes a first conductivity-type nitride semiconductor layer, a first superlattice layer disposed on the first conductivity-type nitride semiconductor layer, a pit forming layer disposed on the first superlattice layer and having a plurality of V-shaped pits, a second superlattice layer, an active layer, and a second conductivity-type nitride semiconductor layer disposed on the active layer and filling the V-shaped pits. The second superlattice layer is disposed on the pit forming layer and has windings that have the same shape as a shape of windings generated by the V-shaped pits. The active layer is disposed on the second superlattice layer and has windings that have the same shape as the shape of the windings generated by the V-shaped pits.

20 Claims, 12 Drawing Sheets

(56) References Cited

U.S. PATENT DOCUMENTS

| | | |
|---|---|---|
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,973,303 B2 | 7/2011 | Sakong et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,030,640 B2 | 10/2011 | Oh et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,877 B2 | 3/2013 | Jeong |
| 8,399,944 B2 | 3/2013 | Kwak et al. |
| 8,432,511 B2 | 4/2013 | Jeong |
| 8,440,996 B2 | 5/2013 | Kang et al. |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |

FOREIGN PATENT DOCUMENTS

| | | |
|---|---|---|
| KR | 10-2012-0100369 A | 9/2012 |
| KR | 10-2013-0026670 A | 3/2013 |
| KR | 10-2013-0061306 A | 6/2013 |
| KR | 10-2013-0061981 A | 6/2013 |

NITRIDE SEMICONDUCTOR LIGHT EMITTING DEVICE

CROSS-REFERENCE TO RELATED APPLICATION

This application claims benefit of priority to Korean Patent Application No. 10-2014-0012538 filed on Feb. 4, 2014, with the Korean Intellectual Property Office, the entire content of which is incorporated herein by reference.

TECHNICAL FIELD

The present disclosure relates to a nitride semiconductor light emitting device and a method of fabricating the same.

BACKGROUND

Semiconductor light emitting devices are devices generating light within a specific wavelength band using electron-hole combination. Since semiconductor light emitting devices have advantages such as relatively long lifespans, low power consumption, and rapid initial start-up characteristics, compared to filament-based light sources, demand for semiconductor light emitting devices is constantly increasing. In particular, group III-nitride semiconductor materials capable of emitting short-wavelength blue light are prominent.

Recently, research into improving the light emission efficiency of semiconductor light emitting devices has been actively conducted. In particular, various methods of improving light emission efficiency and light emission amounts in semiconductor light emitting devices are being developed.

SUMMARY

An aspect of the present disclosure may provide nitride semiconductor light emitting device having excellent light emission efficiency and light emission amounts.

The technical objectives of the inventive concept are not limited to the above disclosure; other objectives may become apparent to those of ordinary skill in the art based on the following descriptions.

One aspect of the present disclosure relates to a nitride semiconductor light emitting device including a first conductivity-type nitride semiconductor layer, a first superlattice layer disposed on the first conductivity-type nitride semiconductor layer, a pit forming layer disposed on the first superlattice layer and having a plurality of V-shaped pits, a second superlattice layer disposed on the pit forming layer and having windings that have the same shape as a shape of windings generated by the V-shaped pits, an active layer disposed on the second superlattice layer and having windings that have the same shape as the shape of the windings generated by the V-shaped pits, and a second conductivity-type nitride semiconductor layer disposed on the active layer and filling the V-shaped pits.

The pit forming layer may include a first conductivity-type nitride semiconductor.

The first conductivity-type nitride semiconductor layer may have a first impurity concentration, and the pit forming layer may have a second impurity concentration lower than the first impurity concentration.

The first impurity concentration may be $2\times10^{18}/cm^3$ or more, and the second impurity concentration may be $1\times10^{18}/cm^3$ or less.

The pit forming layer may have a thickness of at least 0.1 μm.

A lower portion of the pit forming layer under the V-shaped pit may have a thickness less than or equal to ⅕ of a thickness of the pit forming layer.

The first conductivity-type nitride semiconductor layer may include a plurality of dislocations, and the V-shaped pits may be defined in portions corresponding to the dislocations.

Each of the first and second superlattice layers may be formed by alternately stacking first and second nitride layers having different compositions, and the first and second nitride layers may be formed of $Al_xIn_yGa_{1-x-y}N$ ($0 \le x \le 1$, $0 \le y \le 1$, and $0 \le x+y \le 1$) having different compositions.

The first nitride layer may be GaN, and the second nitride layer may be $Al_xGa_{1-x}N$ ($0 < x \le 1$). Alternatively, the first nitride layer may be $In_yGa_{1-y}N$ ($0 < y \le 1$), and the second nitride layer may be GaN.

The first and second nitride layers of the first superlattice layer may be nitride semiconductor materials having the same compositions as the first and second nitride layers of the second superlattice layer, respectively.

The first and second nitride layers of the second superlattice layer may be formed in five pairs of stacked layers or less.

At least one of the first and second superlattice layers may include AlGaN, GaN and InGaN such that AlGaN, GaN and InGaN are repeatedly stacked.

The active layer may be formed by alternately stacking a plurality of quantum well layers and a plurality of quantum barrier layers, and the second superlattice layer may be formed by alternately stacking a plurality of first nitride layers and a plurality of second nitride layers. The first and second nitride layers may be respectively formed of nitride semiconductor materials having the same compositions as the quantum well layer and the quantum barrier layer.

The first nitride layer may have a thickness smaller than a thickness the quantum well layer.

The second conductivity-type nitride semiconductor layer may include a planarization layer filling the V-shaped pits and doped with second conductivity-type impurities, and a second conductivity-type contact layer formed on the planarization layer.

The planarization layer may include an AlGaN layer doped with second conductivity-type impurities, and the second conductivity-type contact layer may include a GaN layer doped with further second conductivity-type impurities.

The planarization layer may include a superlattice layer formed of AlGaN and GaN doped with second conductivity-type impurities, and the second conductivity-type contact layer may include a GaN layer doped with further second conductivity-type impurities. The V-shaped pit may have an inclined (1-101) face.

Another aspect of the present disclosure encompasses a nitride semiconductor light emitting device including a method of fabricating a nitride semiconductor light emitting device. According to the method, a first superlattice layer is formed on a first conductivity-type nitride semiconductor layer. A pit forming layer having a plurality of V-shaped pits is formed on the first superlattice layer. A second superlattice layer configured to maintain windings generated by the V-shaped pits is formed on the pit forming layer. An active layer configured to maintain the windings generated by the V-shaped pits is formed in the second superlattice layer. A second conductivity-type nitride semiconductor layer configured to fill the V-shaped pits is formed on the active layer.

The forming of the pit forming layer may be performed at a lower temperature than forming of the first conductivity-type nitride semiconductor layer.

The forming of the pit forming layer may be performed at a temperature of about 950° C. or less.

The forming of the second conductivity-type nitride semiconductor layer may be performed at a temperature of about 1000° C. or more.

Still another aspect of the present disclosure relates to a light emitting module including a circuit board including a first electrode structure and a second electrode structure, and the nitride semiconductor light emitting device described in the aforementioned aspects of the present disclosure and mounted on the circuit board. The first and second electrodes of the nitride semiconductor light emitting device are respectively connected to the first and second electrode structures.

Still another aspect of the present disclosure encompasses an illuminating apparatus including a light emitting module including the nitride semiconductor light emitting device described in the aforementioned aspects of the present disclosure, a driving unit configured to drive the light emitting module, and an external connection unit configured to supply an external voltage to the driving unit.

BRIEF DESCRIPTION OF DRAWINGS

The above and other aspects, features and other advantages of the present disclosure will be more clearly understood from the following detailed description taken in conjunction with the accompanying drawings, in which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

DETAILED DESCRIPTION

Figure 1:
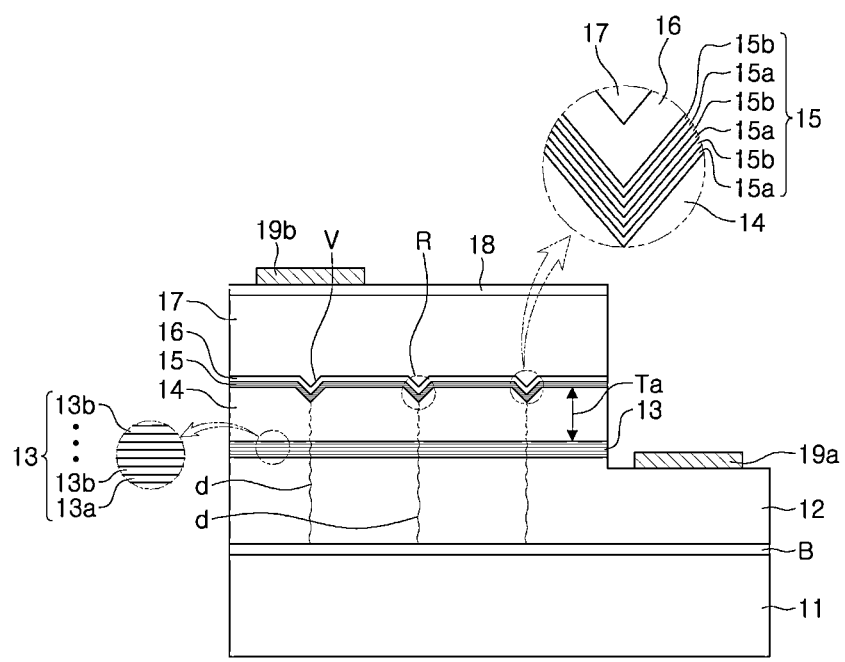
FIG. 1 is a cross-sectional view illustrating a nitride semiconductor light emitting device according to an exemplary embodiment of the present inventive concept.

Hereinafter, embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements. In addition, terms, such as "upper part," "upper surface," "lower part," "lower surface," "side surface," and the like may be used herein on the basis of the drawings, and may be changed depending on the direction in which a device is arranged.

Meanwhile, the term "an exemplary embodiment" used throughout this specification does not refer to the same exemplary embodiment, and the term is provided to emphasize a particular feature or characteristic different from another exemplary embodiment. However, exemplary embodiments provided hereinafter are considered to be able to be implemented by being combined in whole or in part one with another. For example, one element described in a particular embodiment, even if it is not described in another exemplary embodiment, may be understood as a description related to another exemplary embodiment, unless an opposite or contradictory description is provided therein.

FIG. 1 is a cross-sectional view illustrating a nitride semiconductor light emitting device according to an exemplary embodiment of the present inventive concept.

As illustrated in FIG. 1, a nitride semiconductor light emitting device 10 may be located on a substrate 11, and include a stacked semiconductor structure having a plurality of V-shaped pits. A buffer layer B may be formed on the substrate 11 before the stacked semiconductor structure is formed.

The stacked semiconductor structure may include a first conductivity-type nitride semiconductor layer 12, a first superlattice layer 13, a pit forming layer 14, a second superlattice layer 15, an active layer 16, and a second conductivity-type nitride semiconductor layer 17, sequentially stacked on the substrate 11.

The nitride semiconductor light emitting device 10 according to an exemplary embodiment of the present inventive concept may include two superlattice layers 12 and 14. That is, the first superlattice layer 13 may be disposed between the first conductivity-type nitride semiconductor layer 12 and the pit forming layer 14. Further, the second superlattice layer 15 may be disposed on the pit forming layer 14.

The pit forming layer 14 may be located on the first superlattice layer 13, and include a plurality of V-shaped pits formed on a top surface of the pit forming layer 14. The second superlattice layer 15 may be disposed on the pit forming layer 14 in such a manner that windings, which may also be called as curved lines or depressions in the specification, formed by the V-shaped pits are maintained, e.g., the second superlattice layer 15 also has windings having the same shape as or a shape similar to a shape of the windings formed by the V-shaped pits. In other words, the second supperlattice layer 15 has depression conforming to a shape as a shape of the V-shaped pits. The active layer 16 may be disposed on the second superlattice layer 15 in such a manner that the windings formed by the V-shaped pits are maintained, e.g., the active layer 16 also has windings having the same shape as or a shape similar to a shape of the windings formed by the V-shaped pits. The second conductivity-type nitride semiconductor layer 17 may be disposed on the active layer 16 in such a manner that the V-shaped pits are filled.

In portions in which the V-shaped pits are filled by the second conductivity-type nitride semiconductor layer 17, p-type impurities such as Mg may diffuse into the active layer 16, and thereby a high resistance region R may be formed due to a P-N junction in the V-shaped pits. Accordingly, since the portions in which the V-shaped pits are filled are provided as an electrically high resistance region R, a leakage current problem or degradation in constant voltage characteristics caused by dislocations d can be solved. In addition, since the high resistance regions R are distributed in the entire active layer 16, currents can be more smoothly supplied to the active layer located in a flat area. Accordingly, a useful current spreading effect due to the high resistance region R generated by the V-shaped pits can be expected.

The high resistance region R may be formed in the windings generated by the V-shaped pits maintained after the active layer 16 is formed. Accordingly, when the V-shaped pits are planarized before the second conductivity-type nitride semiconductor layer 17 is formed, the high resistance region R may not be formed. However, since the thicknesses of the active layer 16 and the second superlattice layer 15 grown from the inside of the V-shaped pits tend to be greater than the thickness of those grown in other regions (especially when grown at a high temperature), the possibility of the V-shaped pits being gradually filled up may increase as the number of stacked layers increases.

Accordingly, in order to maintain the windings of the V-shaped pits after the active layer 16 is formed, the number of stacked layers of the second superlattice layer 15 may be limited, and the second superlattice layer 15 may be formed in five pairs of stacked layers or less, and more preferably in three pairs of stacked layers or less. Even when the second superlattice layer 15 has a small number of stacked layers, a stress releasing effect may be sufficiently expected by introducing the first superlattice layer 13.

More specifically, the first superlattice layer 13 may be located below the pit forming layer 14 to effectively release a stress applied to a quantum well layer of the active layer 16 and suppress the propagation of dislocations d existing in the first conductivity-type nitride semiconductor layer 12.

Further, the first superlattice layer 13 may apply a large amount of stress to the growing pit forming layer 14 so that the V-shaped pits are relatively quickly formed. This will be described in more detail in FIG. 4.

Likewise, the number of stacked layers of the second superlattice layer 15 for obtaining the same stress releasing effect may be reduced by introducing the first superlattice layer 13. Further, the windings generated by the V-shaped pits may be maintained while the stress releasing effect is maintained, even after the active layer 16 is formed.

The nitride semiconductor light emitting device 10 may have a shape in which the stacked semiconductor structure is mesa-etched to expose portions of the first conductivity-type nitride semiconductor layer 12. The nitride semiconductor light emitting device 10 may include an ohmic contact layer 18 formed on the second conductivity-type nitride semiconductor layer 17, and first and second electrodes 19a and 19b respectively formed on an exposed portion of the first conductivity-type nitride semiconductor layer 12 and a portion of the ohmic contact layer 18.

Substrate 11

The substrate 11 may include an insulating, a conductive, or a semiconductive substrate as needed. For example, the substrate 11 may include sapphire, SiC, Si, $MgAl_2O_4$, MgO, $LiAlO_2$, $LiGaO_2$, or GaN.

The substrate 11 may be completely or partially removed or patterned before or after the stacked semiconductor structure is grown, in order to efficiently extract light or improve electrical properties. For example, when the substrate 11 is a sapphire substrate, the substrate 11 may be removed by radiating a laser beam to an interface between the stacked semiconductor structure and the substrate 11. In addition, a silicon or silicon carbide substrate may be removed by polishing, etching, and the like.

The patterning of the substrate 11 may improve light extraction efficiency by embossing or forming a slope on a main surface (e.g., at least one of a crystal growth side and an opposite side thereof) or a side surface before or after the stacked semiconductor structure is grown. The size of pattern may be selected from a range of 5 nm to 500 μm. Light extraction efficiency may be improved by regular or irregular patterns. Those patterns may have a variety of shapes, such as a pillar shape, a mountain shape, or a semi-spherical shape.

Buffer Layer B

When a GaN thin film is grown on a dissimilar substrate such as a Si substrate, dislocation density may increase due to mismatch in lattice constants between a substrate material and a thin film material, and crack or warpage may occur due to difference in thermal expansion coefficients. To alleviate the problem, the buffer layer B may be disposed between the substrate 11 and the stacked semiconductor structure.

As the buffer layer B, $Al_xIn_yGa_{1-x-y}N$ (0≤x≤1 and 0≤y≤1), or especially GaN, AlN, AlGaN, InGaN, or InGaNAlN may be used, or $ZrB_2$, $HfB_2$, ZrN, HfN, or TiN may be used as needed. In addition, those materials may be used as the buffer layer B by combining two or more layers or gradually changing the composition.

When Si is used as the substrate 11, warpage or breakage may occur due to difference in thermal expansion coefficients between Si and GaN, or defects may occur due to a difference in lattice constants. Accordingly, since defect control and stress control are required at the same time in order to suppress warpage, a composite structured buffer layer B may be used. The buffer layer B may be a crystal with no Ga in order to prevent reaction between Ga and Si elements of the substrate 11. For example, the buffer layer B may be AlN or SiC. In addition, when a plurality of AlN layers are used, an AlGaN interlayer may be interposed between AlN and GaN in order to control stress.

First Conductivity-Type Nitride Semiconductor Layer 12

The first conductivity-type nitride semiconductor layer 12 may be a nitride single crystal having a composition of $Al_xIn_yGa_{1-x-y}N$ (0≤x≤1, 0≤y≤1, and 0≤x+y≤1). The first conductivity-type nitride semiconductor layer 12 may be formed of a semiconductor in which n-type impurities are doped. The n-type impurities may be Si. For example, the first conductivity-type nitride semiconductor layer 12 may be n-type GaN.

The first conductivity-type nitride semiconductor layer 12 may be provided as a contact layer, and may have a relatively high concentration to reduce a driving voltage (Vf). For example, the concentration of n-type impurities in the first conductivity-type nitride semiconductor layer 12 may be $2 \times 10^{18}/cm^3$ or more.

The first conductivity-type nitride semiconductor layer 12 may be implemented in a single layered structure having the same composition, or in a multilayered structure having different compositions or thicknesses, as needed. For example, the first conductivity-type nitride semiconductor layer 12 may include an electron injection layer by which electron injection efficiency is improved.

First Superlattice Layer 13

The first superlattice layer 13 may be formed by alternately stacking first and second nitride layers 13a and 13b having different compositions. The first and second nitride layers 13a and 13b may be $Al_xIn_yGa_{1-x-y}N$ ($0 \le x \le 1$, $0 \le y \le 1$, and $0 \le x+y \le 1$) having different compositions. The first superlattice layer 13 may be doped with n-type impurities such as Si, or undoped.

In some exemplary embodiments of the present inventive concept, the first nitride layer 13a may be $In_yGa_{1-y}N$ ($0 < y \le 1$), and the second nitride layer 13b may be GaN. In other exemplary embodiments of the present inventive concept, the first nitride layer 13a may be GaN, and the second nitride layer 13b may be $Al_xGa_{1-x}N$ ($0 < x \le 1$). The first superlattice layer 13 may be formed of three different kinds of nitride layers, as needed. For example, AlGaN/GaN/InGaN may be repeatedly stacked.

The thicknesses of the first and second nitride layers 13a and 13b may be in the range of about 0.5 to 20 nm. The first nitride layer 13a may be formed to have a thickness smaller than a thickness of the second nitride layer 13b.

The first and second nitride layers 13a and 13b of the first superlattice layer 13 may be formed of an appropriate number of layers. The first superlattice layer 13 may serve complementing functions of the second superlattice layer 15. Accordingly, by introducing the first superlattice layer 13, a stress releasing effect can be sufficiently obtained even when the number of stacked layers of the second superlattice layer 15 is reduced.

Pit Forming Layer 14

The pit forming layer 14 may be a nitride single crystal having a composition of $Al_xIn_yGa_{1-x-y}N$ ($0 \le x \le 1$, $0 \le y \le 1$, and $0 \le x+y \le 1$) doped with n-type impurities. As the n-type impurities, Si may be used. For example, the pit forming layer 14 may be n-type GaN similar to the first conductivity-type nitride semiconductor layer 12.

The pit forming layer 14 may have a relatively low impurity concentration in order to improve crystallinity. For example, the concentration of n-type impurities in the pit forming layer 14 may be $1 \times 10^{18}/cm^3$ or less.

The thickness Ta (see FIG. 1) of the pit forming layer 14 may be 0.1 μm or more in order to provide the V-shaped pits with a sufficient depth, or may be 0.1 μm or less for efficiency of the process.

Areas in which the V-shaped pits are generated may correspond to areas in which dislocations d exist. As described above, the first superlattice layer 13 disposed below the pit forming layer 14 may relatively quickly generate the V-shaped pits by increasing stress applied during crystal growth. That is, the V-shaped pits having a preferred depth may be provided by the pit forming layer 14 even having a relatively small thickness.

Second Superlattice Layer 15

The second superlattice layer 15 may be formed by alternately stacking first and second nitride layers 15a and 15b having different compositions. The first and second nitride layers 15a and 15b may be $Al_xIn_yGa_{1-x-y}N$ ($0 \le x \le 1$, $0 \le y \le 1$, and $0 \le x+y \le 1$) having different compositions. The second superlattice layer 15 may be doped with n-type impurities such as Si, or undoped.

In some exemplary embodiments of the present inventive concept, the first nitride layer 15a may be $In_yGa_{1-y}N$ ($0 < y \le 1$), and the second nitride layer 15b may be GaN. In other exemplary embodiments of the present inventive concept, the first nitride layer 15a may be GaN, and the second nitride layer 15b may be $Al_xGa_{1-x}N$ ($0 < x \le 1$). The second superlattice layer 15 may be formed of three different kinds of nitride layers, as needed. For example, AlGaN/GaN/InGaN may be repeatedly stacked.

The first and second nitride layers 15a and 15b of the second superlattice layer 15 may be formed of a nitride semiconductor having the same composition as the first and second nitride layers 13a and 13b of the first superlattice layer 13, respectively.

The first and second nitride layers 15a and 15b of the second superlattice layer 15 may be formed of a nitride semiconductor having the same composition as or a similar composition to a composition of a quantum well structure or a quantum barrier structure of the active layer 16. Little light may be generated by electron-hole recombination in the second superlattice layer 15, compared to the active layer 16. Accordingly, the second superlattice layer 15 may be designed to generate a short wavelength light (e.g., green light) so as not to affect the active layer 16.

The thickness of the first and second nitride layers 15a and 15b may be in the range of about 0.5 to 20 nm. The first nitride layer 15a may be formed to have a thickness smaller than a thickness of the second nitride layer 15b. The first nitride layer 15a may have a smaller thickness than the quantum well layer.

The first and second nitride layers 15a and 15b of the second superlattice layer 15 may be, but not limited thereto, formed of five pairs of stacked layers or less, and preferably three pairs of stacked layers or less. Thus, a stress releasing effect can be sufficiently obtained by employing the first superlattice layer 13, even when the number of stacked layers of the second superlattice layer 15 is reduced. Accordingly, the windings of the V-shaped pits may be maintained even after the active layer 16 is formed.

Active Layer 16

The active layer 16 may have a multi-quantum well (MQW) structure in which quantum well layers and quantum barrier layers are alternately stacked. For example, in the case of a nitride semiconductor, a GaN/InGaN structure may be used. Otherwise, a single-quantum well (SQW) structure may be used.

The active layer 16 may be formed to maintain the windings generated by the V-shaped pits. In order to maintain the windings generated by the V-shaped pits, the active layer 16 may be preferably grown at a low temperature (950° C. or less), however, sometimes grown at a high temperature (950° C. or more) depending on the composition. For example, when a InGaN quantum well layer and a GaN quantum barrier layer are formed, each process may be performed at a temperature of 800 to 1100° C., and the GaN quantum barrier layer may be formed at a relatively high temperature compared to the InGaN quantum well layer.

As a result, the thickness of the GaN quantum barrier layer in the V-shaped pits may be greater than the thickness of the GaN quantum barrier layer in other portions, and the V-shaped pits may be gradually filled as the number of stacked layers increases. This phenomenon may occur in the case of the second superlattice layer 15, similarly. Accordingly, in order to maintain the windings of the V-shaped pits even after the active layer 16 is formed, the number of stacked layers in the second superlattice layer 15 may need to be restricted. Even when the number of stacked layers of the second superlattice layer 15 is small, a stress releasing effect can be sufficiently obtained by employing the first superlattice layer 13 below the pit forming layer 14.

Second Conductivity-Type Nitride Semiconductor Layer 17

The second conductivity-type nitride semiconductor layer 17 may be a nitride single crystal having a composition of $Al_xIn_yGa_{1-x-y}N$ ($0 \leq x \leq 1$, $0 \leq y \leq 1$, and $0 \leq x+y \leq 1$) doped with p-type impurities. As the p-type impurities, Zn, Cd, Be, Mg, Ca, Ba, and the like may be used, and Mg may be usually used.

The second conductivity-type nitride semiconductor layer 17 may fill the V-shaped pits to be planarized. For this, the second conductivity-type nitride semiconductor layer 17 may be grown at a high temperature (1000° C.). In this process, the p-type impurities such as Mg may be concentrated at portions in which the V-shaped pits are disposed, and diffused into the active layer 16 located at the portions. Accordingly, a high resistance area may be formed at the V-shaped pits due to the P-N junction. Thus, as described above, electrical properties of the nitride semiconductor light emitting device 10 may be significantly improved.

The second conductivity-type nitride semiconductor layer 17 may be implemented in a single layer structure, or in a multilayered structure having different compositions or thicknesses, as needed. For example, the second conductivity-type nitride semiconductor layer 17 may further include a layer for improving hole injection efficiency, or an electron barrier layer.

For example, the second conductivity-type nitride semiconductor layer 17 may include an electron barrier layer having a large band-gap between the active layer 16 and the p-type GaN contact layer. For example, the electron barrier layer may be a p-type AlGaN layer. In other exemplary embodiments of the present inventive concept, a superlattice structure in which two or more kinds of $In_xAl_yGa_{(1-x-y)}N$ layers having different compositions or different impurity contents are repeatedly stacked on the active layer 16 may be used. For example, as the superlattice structure, a p-type AlGaN/GaN superlattice layer may be used.

Ohmic Contact Layer 18/1$^{st}$ and 2$^{nd}$ Electrodes 19a and 19b

The ohmic contact layer 18 may have a relatively high impurity concentration to reduce ohmic contact resistance, lower an operating voltage of a device, and improve device characteristics.

As described above, the nitride semiconductor light emitting device 10 illustrated in FIG. 1 may have a flip-chip structure in which the first and second electrodes 19a and 19b are provided on surfaces opposite to a light extracting surface. In this case, the ohmic contact layer 18 may be a high reflective ohmic contact layer, and include a high reflective material. For example, the ohmic contact layer 18 may be formed of a single or multiple layer selected from Ag, Ni, Al, Rh, Pd, Ir, Ru, Mg, Zn, Pt, and Au. In addition, the ohmic contact layer 18 may further include GaN, InGaN, ZnO, or a graphene layer.

The first and second electrodes 19a and 19b may include Ag, Ni, Al, Rh, Pd, Ir, Ru, Mg, Zn, Pt, Au, or the like, and have a structure having two or more layers such as Ni/Ag, Zn/Ag, Ni/Al, Zn/Al, Pd/Ag, Pd/Al, Ir/Ag, Ir/Au, Pt/Ag, Pt/Al, or Ni/Ag/Pt.

Herein after, a method of fabricating a semiconductor light emitting device according to an exemplary embodiment of the present inventive concept will be described with reference to FIGS. 2 to 7.

FIGS. 2 to 7 are cross-sectional views illustrating main processes of the method of fabricating a semiconductor light emitting device according to the exemplary embodiment of the present inventive concept.

Figure 2:
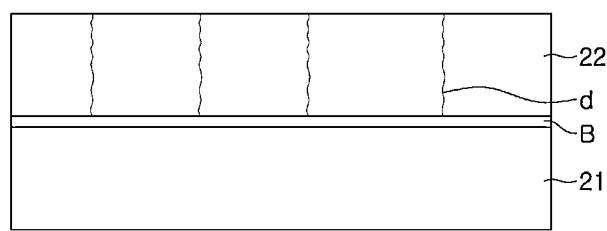
FIGS. 2 to 7 are cross-sectional views illustrating main processes in a method of fabricating a semiconductor light emitting device according to an exemplary embodiment of the present inventive concept.

As illustrated in FIG. 2, a first conductivity-type nitride semiconductor layer 22 is grown on a substrate 21. A buffer layer B may be formed as needed.

The substrate 21 may be sapphire, SiC, Si, $MgAl_2O_4$, MgO, $LiAlO_2$, $LiGaO_2$, or GaN. The buffer layer B may include $Al_xIn_yGa_{1-x-y}N$ ($0 \leq x \leq 1$ and $0 \leq y \leq 1$), for example, GaN, AlN, AlGaN, InGaN, and InGaNAlN.

The growth of a stacked semiconductor structure including the first conductivity-type nitride semiconductor layer 22 may be performed using a process such as a metal organic chemical vapor deposition (MOCVD) process, a molecular beam epitaxy (MBE) process, and the like. When using an MOCVD apparatus, a metal compound gas (e.g., trimethyl gallium (TMG), trimethyl aluminum (TMA), etc.) and a nitrogen-containing gas (ammonia (NH3), etc.) may be supplied as reaction gases to a reaction container in which the substrate 21 is installed, and a preferred nitride single crystal may be grown while maintaining the substrate 21 at a high temperature (e.g., 1000 to 1300° C.).

The first conductivity-type nitride semiconductor layer 22 may be a nitride single crystal having a composition of $Al_xIn_yGa_{1-x-y}N$ ($0 \leq x \leq 1$, $0 \leq y \leq 1$, and $0 \leq x+y \leq 1$). The first conductivity-type nitride semiconductor layer 22 may be n-type GaN. The concentration of n-type impurities in the first conductivity-type nitride semiconductor layer 12 may be $2 \times 10^{18}/cm^3$ or more. The first conductivity-type nitride semiconductor layer 22 may include dislocations d. In order to improve crystallinity, as needed, an undoped GaN layer may be formed before the first conductivity-type nitride semiconductor layer 22 is formed.

Figure 3:
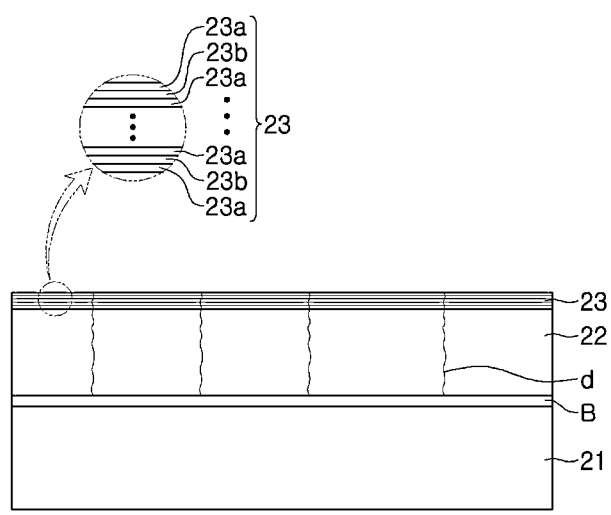

Next, as illustrated in FIG. 3, a first superlattice layer may be formed on the second conductivity-type nitride semiconductor layer 22.

The first superlattice layer 23 may be formed in such a manner that first and second nitride layers 23a and 23b having different compositions are alternately stacked. The first and second nitride layers 23a and 23b may be $Al_xIn_yGa_{1-x-y}N$ ($0 \leq x \leq 1$, $0 \leq y \leq 1$, and $0 \leq x+y \leq 1$) having different compositions. The first superlattice layer 23 may be doped with n-type impurities such as Si, or undoped.

The thicknesses of the first and second nitride layers 23a and 23b may be in the range of about 0.5 to 20 nm. The first nitride layer 23a may have a thickness smaller than a thickness of the second nitride layer 23b.

The first superlattice layer 23 may block the dislocations d. By introducing the first superlattice layer 23, a stress releasing effect may be sufficiently obtained even when the number of stacked layers of the second superlattice layer 25 is reduced.

Figure 4:
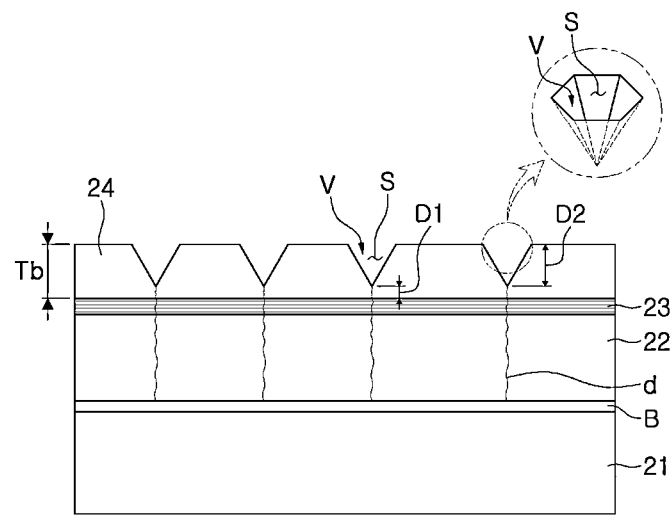

Next, as illustrated in FIG. 4, a pit forming layer 24 having a plurality of V-shaped pits V may be formed on the first superlattice layer 23.

The pit forming layer 24 may be a nitride single crystal having a composition of $Al_xIn_yGa_{1-x-y}N$ ($0 \leq x \leq 1$, $0 \leq y \leq 1$, and $0 \leq x+y \leq 1$) doped with n-type impurities. For example, the pit forming layer 24 may be n-type GaN, similar to the first conductivity-type nitride semiconductor layer 22.

The pit forming layer 24 may have a relatively low impurity concentration in order to improve crystallinity. For example, the concentration of n-type impurities in the pit forming layer 24 may be $1 \times 10^{18}/cm^3$ or less.

The formation of the V-shaped pits may be implemented by growing the pit forming layer 24 at a relatively low temperature. For example, the pit forming layer 24 may be grown at a temperature of 950° C. or less. The V-shaped pits may be generated while releasing a tensile stress generated in the crystal growth process. The V-shaped pits may correspond to a region in which dislocations d exist.

When a top surface of the substrate 21 is grown from a c-face, an inclined surface S of a pit V may be a (1-101) face. A thickness Tb (see FIG. 4) of the pit forming layer 24 may be 0.1 µm or more in order to supply V-shaped pits having a sufficient depth.

If the thickness Tb of the pit forming layer 24 is the same, e.g., the thickness Tb is constant, the pit V may have a more sufficient depth D2, as a thickness D1 of a portion in which the pit V is formed decreases. The first superlattice layer 23 disposed below the pit forming layer 24 may increase stress applied during the crystal growth process, and thus the pit V may be generated relatively quickly. Although depending on conditions of the crystal growth process, the thickness D1 of a portion of the pit forming layer 24 under the pit V (i.e., a portion under a vertex of the pit V) may be ⅕ or less of the total thickness Tb of the pit forming layer 24.

Figure 5:
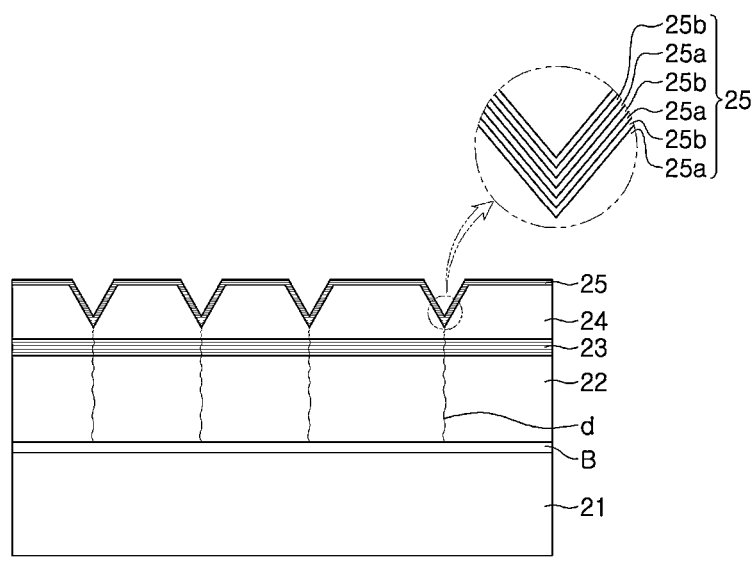

Next, as illustrated in FIG. 5, a second superlattice layer 25 may be formed on the pit forming layer 24 in such a manner that windings by the V-shaped pits are maintained, e.g., the second superlattice layer 25 has windings having the same shape or a shape similar to a shape of the windings of the V-shaped pits.

The second superlattice layer 25 may be formed by alternately stacking first and second nitride layers 25a and 25b having different compositions. The first and second nitride layers 25a and 25b may be $Al_xIn_yGa_{1-x-y}N$ (0≤x≤1, 0≤y≤1, and 0≤x+y≤1) having different compositions. The second superlattice layer 25 may be doped with n-type impurities such as Si, or undoped.

In some exemplary embodiments of the present inventive concept, the first nitride layer 25a may be $In_yGa_{1-y}N$ (0<y≤1), and the second nitride layer 25b may be GaN. In other exemplary embodiments of the present inventive concept, the first nitride layer 25a may be GaN, and the second nitride layer 25b may be $Al_xGa_{1-x}N$ (0<x≤1). As needed, the second superlattice layer 25 may be formed of three different kinds of nitride layers. For example, AlGaN/GaN/InGaN may be repeatedly stacked.

The first and second nitride layers 25a and 25b of the second superlattice layer 25 may be formed of a nitride semiconductor having the same composition as the first and second nitride layers 23a and 23b of the first superlattice layer 23, respectively.

The first and second nitride layers 25a and 25b of the second superlattice layer 25 may be formed of a nitride semiconductor having the same composition as or a similar composition to the quantum well layer and the quantum barrier layer of the active layer 26. The thickness of the first and second nitride layers 25a and 25b may be about 0.5 to 20 nm. The first nitride layer 25a may be formed to have a thickness smaller than a thickness of the second nitride layer 25b. The first nitride layer 25a may have a smaller thickness than the quantum well layer.

The first and second nitride layers 25a and 25b of the second superlattice layer 25 may be, but not limited thereto, formed of five pairs of stacked layers or less, and preferably three pairs of stacked layers or less. Thus, a stress releasing effect can be sufficiently obtained by employing the first superlattice layer 23, even when the number of stacked layers of the second superlattice layer 15 is reduced. Accordingly, the windings generated by the V-shaped pits can be maintained even after the active layer 26 is formed.

Figure 6:
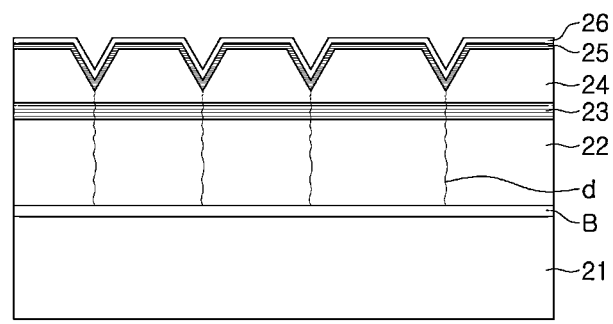

Next, as illustrated in FIG. 6, an active layer 26 may be formed on the second superlattice layer 25 in such a manner that the windings generated by the V-shaped pits are maintained, e.g., the active layer 26 has windings having the same shape or a shape similar to a shape of the windings of the V-shaped pits.

The active layer 26 may be a single- or multi-quantum well structure. The active layer 26 may be a GaN/InGaN structure when having the multi-quantum well structure.

Vertical and lateral growth rates of the active layer 26 may be controlled to maintain the windings generated by the plurality of V-shaped pits and not to fill the V-shaped pits. The growth rates may be controlled by controlling a flow rate of precursors, a pressure, and a temperature of growth. For example, when a temperature of growth is controlled, a low temperature growth (at 950° C. or less) may be preferable.

However, high temperature growth (at 950° C. or more) may be performed depending on the composition. For example, when forming a InGaN quantum well layer and a GaN quantum barrier layer, each process may be performed at a temperature of 800 to 1100° C., and the GaN quantum barrier layer may be formed at a relatively high temperature compared to InGaN quantum well layer.

Figure 7:
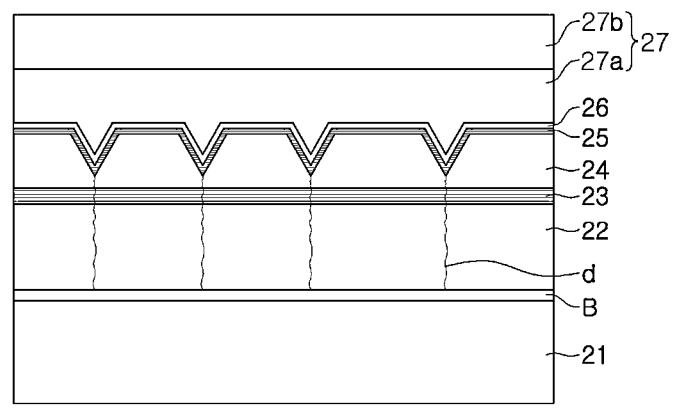

Next, as illustrated in FIG. 7, a second conductivity-type nitride semiconductor layer 27 may be formed on the active layer 26 in such a manner that the windings generated by the V-shaped pits are filled.

The second conductivity-type nitride semiconductor layer 27 may be a nitride single crystal having a composition of $Al_xIn_yGa_{1-x-y}N$ (0≤x≤1, 0≤y≤1, and 0≤x+y≤1) doped with p-type impurities. Mg may be used as the p-type impurities.

The process may be performed at a relatively high temperature (e.g., 1000° C. or more) to fill the V-shaped pits using the second conductivity-type nitride semiconductor layer 27.

According to an exemplary embodiment of the present inventive concept, the second conductivity-type nitride semiconductor layer 27 may have a first layer 27a and a second layer 27b. The second layer 27b may be a contact layer such as p-type GaN. The first layer 27a may be a planarization layer filling the V-shaped pits. In particular, the first layer 27a may be an electron barrier layer formed of a large band-gap nitride layer. For example, the electron barrier layer may be a p-type AlGaN layer. For another example, the electron barrier layer may have a superlattice structure in which $In_xAl_yGa_{(1-x-y)}N$ layers having different compositions are repeatedly stacked. The electron barrier layer may have, for example, a p-type AlGaN/GaN superlattice structure.

In order to verify effects according to the exemplary embodiments of the present inventive concept, nitride semiconductor light emitting devices were fabricated in two different conditions as follows, as an Improvement Example and a Comparative Example, and light emission amounts and operating voltages are measured.

Improvement Example

A nitride semiconductor light emitting device according to an embodiment of the present inventive concept was fabricated using a MOCVD apparatus. First, an n-type GaN layer doped with Si (an impurity concentration of about $4\times10^{18}$/cm$^3$) was formed on a c-face of a sapphire substrate at a temperature of 1240° C.

An InGaN/GaN layer was formed as a first superlattice layer on the n-type GaN layer. Next, an n-type GaN layer (having an impurity concentration of about $6\times10^{17}$/cm$^3$) having a thickness of 400 nm was grown as a pit forming layer on the first superlattice layer. The pit forming layer was grown at a temperature of 890° C. to form V-shaped pits. Next, a second superlattice layer (InGaN/GaN) and an active layer were formed in such a manner that windings generated by the V-shaped pits are maintained, and then a p-type AlGaN/GaN layer was formed. Thus, the nitride semiconductor light emitting device was fabricated.

In this process, the first and second superlattice layers were formed under the conditions listed in Table 1.

TABLE 1

| Items | First Superlattice Layer | Second Superlattice Layer |
| --- | --- | --- |
| Number of Pairs | 3 | 3 |
| In Content of InGaN layer (%) | 14~16 | 14~16 |
| InGaN/GaN Thickness (nm) | 1.0/5.0 | 1.0/5.0 |
| Growth Temperature (° C.) | 810~1000 | 810~1000 |

Comparative Example

A nitride semiconductor light emitting device was fabricated using a MOCVD apparatus, similar to the Improvement Example. However, the nitride semiconductor light emitting device only includes a second superlattice layer having four pairs of stacked layers, and does not include a first superlattice layer (see Improvement Example: three pairs of stacked layers).

Figure 8:
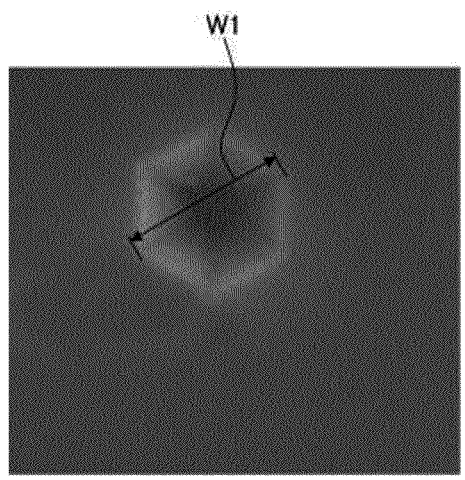
FIGS. 8 and 9 are SEM images of V-shaped pits respectively taken from an Improvement Example and a Comparative Example.
Figure 9:
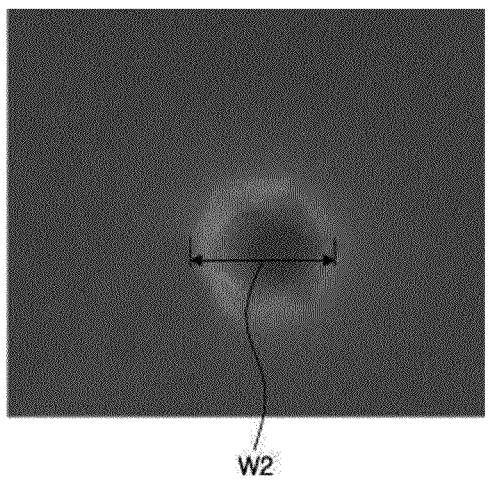

V-shaped pits formed in the processes of fabricating the nitride semiconductor light emitting devices according to the Improvement Example and the Comparative Example were photographed as SEM images, and sizes of the V-shaped pits were measured. FIGS. 8 and 9 are SEM images of the V-shaped pits respectively taken from the Improvement Example and the Comparative Example. The sizes of the V-shaped pits respectively taken from the Improvement Example and the Comparative Example are shown in Table 2.

TABLE 2

| Item | Improvement Example | Comparative Example |
| --- | --- | --- |
| Pit Width | 360 nm (W1 in FIG. 8) | 310 nm (W2 in FIG. 9) |
| Pit Depth (Pit Generation Position) | 339.5 nm (60.5 nm) | 300 nm (100 nm) |
| Ratio of Pit Depth to Layer Thickness | 0.85 | 0.75 |

As indicated in Table 2, the pit forming layers are formed under the same conditions in the Improvement Example and the Comparative Example. However, a width and a depth of the V-shaped pits in the Improvement Example were greater than a width and a depth of the V-shaped pits in the Comparative Example. This can be explained by a difference in the introduction of the first superlattice layer. That is, since a higher degree of stress is applied to a growing pit forming layer by introducing the first superlattice layer in the Improvement Example, the V-shaped pits may be induced more quickly than in the Comparative Example. As a result, even when the pit forming layers having the same thickness are formed, greater V-shaped pits can be obtained in the Improvement Example than in the Comparative Example.

Figure 10:
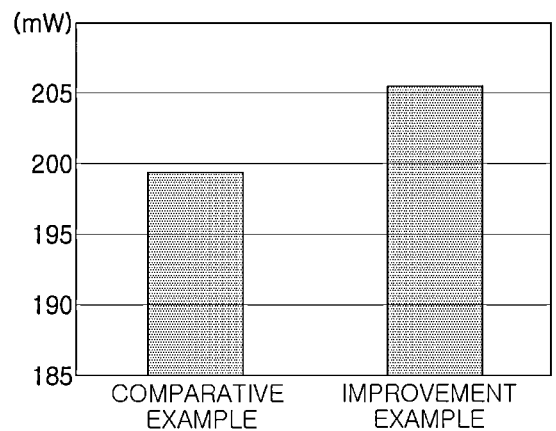
FIG. 10 is a graph illustrating light emission amounts of nitride semiconductor light emitting devices according to the Improvement Example and the Comparative Example.
Figure 11:
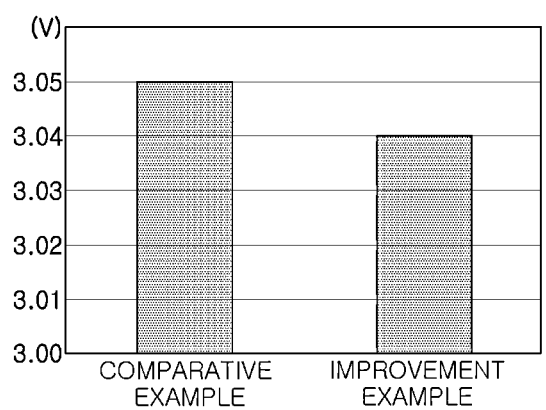
FIG. 11 is a graph illustrating operating voltages of nitride semiconductor light emitting devices according to the Improvement Example and the Comparative Example.

Next, light emission amounts and operating voltages of the nitride semiconductor light emitting devices fabricated according to the Improvement Example and the Comparative Example were measured. FIGS. 10 and 11 are graphs illustrating light emission amounts and operating voltages of the nitride semiconductor light emitting devices fabricated according to the Improvement Example and the Comparative Example.

As illustrated in FIG. 10, light emission amounts in the Improvement Example is 206.2 mW, which is improved value by 3.5% compared to light emission amounts in the Comparative Example (199.0 mW). Further, an operating voltage in the Improvement Example is 3.04 V, as illustrated in FIG. 11, which is reduced in value by 0.3% compared to an operating voltage in the Comparative Example (3.05V).

That is, the nitride semiconductor light emitting device fabricated according to the Improvement Example in which the first and second superlattice layers were disposed shows better results than the nitride semiconductor light emitting device fabricated according to the Comparative Example in which the first superlattice layer was not disposed (even when the number of stacked layers of the second superlattice layer increases), in terms of both light emission amounts and operating voltage.

Figure 13:
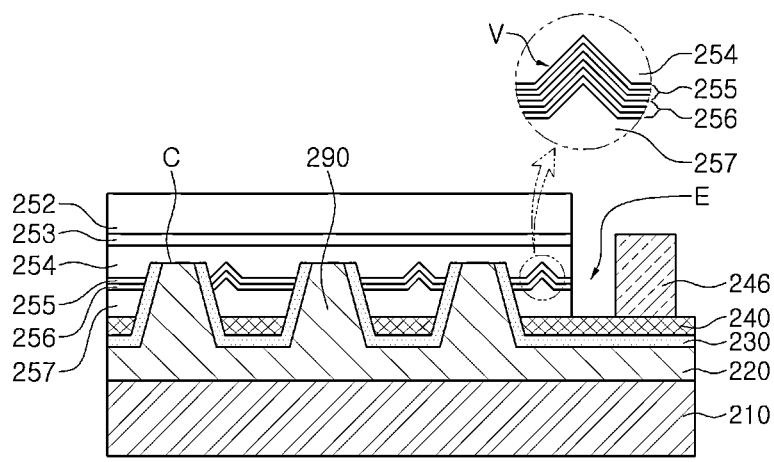
Figure 14:
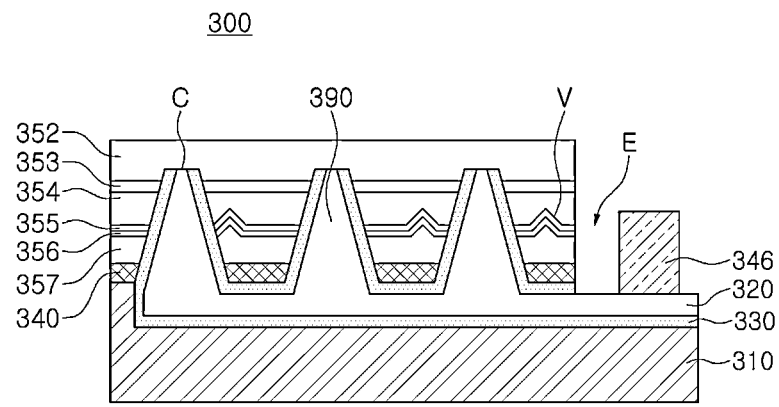
FIG. 14 is a cross-sectional view illustrating a nitride semiconductor light emitting device according to an exemplary embodiment of the present inventive concept.
Figure 15:
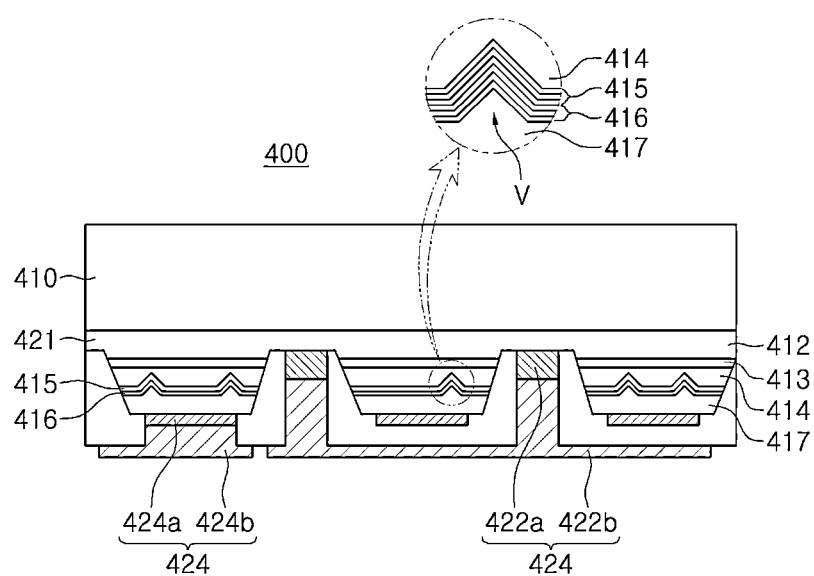
FIG. 15 is a cross-sectional view illustrating a nitride semiconductor light emitting device according to an exemplary embodiment of the present inventive concept.

Exemplary embodiments of the present inventive concept may be applied to various nitride semiconductor light emitting device structures. FIGS. 13 to 15 are cross-sectional views according to various exemplary embodiments of the present inventive concept.

Figure 12:
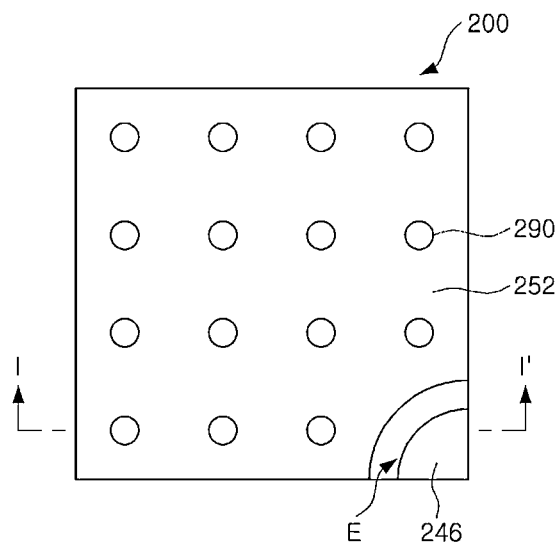
FIGS. 12 and 13 are respectively a plan view and a cross-sectional view of a nitride semiconductor light emitting device according to an exemplary embodiment of the present inventive concept.

FIGS. 12 and 13 are respectively a plan view and a cross-sectional view of a nitride semiconductor light emitting device according to an exemplary embodiment of the present inventive concept.

As illustrated in FIGS. 12 and 13, a semiconductor light emitting device 200 according to an exemplary embodiment of the present inventive concept may include a conductive substrate 210, a first electrode layer 220, an insulating layer 230, a second electrode layer 240, a second conductivity-type nitride semiconductor layer 257, a pit forming layer 254, an active layer 256, and a first conductivity-type nitride semiconductor layer 252.

According to the exemplary embodiment of the present inventive concept, a first superlattice layer 253 may be disposed between the first conductivity-type nitride semiconductor layer 252 and the pit forming layer 254, and a second superlattice layer 255 may be disposed on the pit forming layer 254.

The pit forming layer 254 may be disposed on the first superlattice layer 253, and a plurality of V-shaped pits V may be formed in a top surface of the pit forming layer 254. The second superlattice layer 255 may be disposed on the pit forming layer 254 in such a manner that windings generated by the V-shaped pits V are maintained, e.g., the second superlattice layer 255 has windings having the same shape as or a similar to a shape of the windings generated by the V-shaped pits V. The active layer 256 may be disposed on the second superlattice layer 255 in such a manner that the windings generated by the V-shaped pits V are maintained, e.g., the active layer 256 has windings having the same shape as or a similar to a shape of the windings generated by the V-shaped pits V. The second conductivity-type nitride semiconductor layer 257 may be disposed on the active layer 256 in such a manner that the V-shaped pits V are filled.

The first electrode layer 220 may be disposed on the conductive substrate 210. Further, as illustrated in FIG. 13, a portion of the first electrode layer 220 may extend through a contact hole 290 passing through the insulating layer 230, the second electrode layer 240, the second conductivity-type nitride semiconductor layer 257, the active layer 256, and the second superlattice layer 255, and partially penetrating the pit forming layer 254. The first electrode layer 220 may have a contact area C in contact with the pit forming layer 254. The first electrode layer 220 may be electrically connected to the first conductivity-type nitride semiconductor layer 252 and the conductive substrate 210 through the contact area C.

The second electrode layer 240 may be formed on the insulating layer 230. The second electrode layer 240 may include at least one exposed area, that is, an exposed portion E at an interface with the second conductivity-type nitride semiconductor layer 257 as illustrated in FIG. 13. An electrode pad 246 connecting an external power supply to the second electrode layer 240 may be disposed on the exposed area E.

Otherwise, referring to FIG. 14, in a nitride semiconductor light emitting device 300 according to another exemplary embodiment of the present inventive concept, a first electrode layer 320 connected to a contact hole may be exposed. Further, according to still another exemplary embodiment of the present inventive concept, a contact hole may be provided in a form of extending to a first conductivity-type nitride semiconductor layer 352.

Referring to FIG. 14, the nitride semiconductor light emitting device 300 may include a second conductivity-type nitride semiconductor layer 357, an active layer 356, a second superlattice layer 355, a pit forming layer 354, a first superlattice layer 353, and a first conductivity-type nitride semiconductor layer 352, disposed on a conductive substrate 310.

The pit forming layer 354 may be disposed on the first superlattice layer 353, and has a plurality of V-shaped pits V on a top surface thereof. The second superlattice layer 355 may be disposed on the pit forming layer 354 in such a manner that windings generated by the V-shaped pits V are maintained, e.g., the second superlattice layer 355 has windings having the same shape as or a shape similar to a shape of the windings generated by the V-shaped pits V. In addition, the active layer 356 may be disposed on the second superlattice layer 355 in such a manner that the windings generated by the V-shaped pits V are maintained, e.g., the active layer 356 has windings having the same shape as or a shape similar to a shape of the windings generated by the V-shaped pits V. The second conductivity-type nitride semiconductor layer 357 may be disposed on the active layer 356 in such a manner that the V-shaped pits V are filled.

Differently to the previous exemplary embodiment, e.g., that of FIG. 13, in which the contact hole is connected to the conductive substrate 210, as shown in FIG. 14, a second electrode layer 340 may be disposed between the second conductivity-type nitride semiconductor layer 357 and the conductive substrate 310 in an exemplary embodiment of the present inventive concept. Further, differently to the previous exemplary embodiment, a second electrode layer 340 is not necessarily required to be partially exposed.

As illustrated in FIG. 14, a contact hole 390 having a contact area C in contact with the first conductivity-type nitride semiconductor layer 357 may be connected to the first electrode layer 320, and the first electrode layer 320 may include an exposed portion E. An electrode pad 346 may be formed on the exposed portion E of the first electrode layer 320. The first electrode layer 320 may be electrically isolated from the active layer 356, the second conductivity-type nitride semiconductor layer 357, the second electrode layer 340, and the conductive substrate 310 by an insulating layer 330.

Differently to the previous exemplary embodiment, e.g., that of FIG. 13, in which the contact hole 290 is connected to the conductive substrate 210, referring to FIG. 14, the contact hole 390 in an exemplary embodiment of the present inventive concept may be electrically isolated from the conductive substrate 310, and the first electrode layer 320 connected to the contact hole 390 is exposed. Accordingly, the conductive substrate 310 may be electrically connected the second conductivity-type nitride semiconductor layer 357, and have a different polarity from the previous exemplary embodiment.

FIG. 15 is a cross-sectional view illustrating a nitride semiconductor light emitting device according to still another exemplary embodiment of the present inventive concept.

A nitride semiconductor light emitting device 400 illustrated in FIG. 15 may include a stacked semiconductor structure formed on a substrate 401. The stacked semiconductor structure may include a first conductivity-type nitride semiconductor layer 412, a first superlattice layer 413, a pit forming layer 414, a second superlattice layer 415, an active layer 416, and a second conductivity-type nitride semiconductor layer 417.

The pit forming layer 414 may be located on the first superlattice layer 413, and a plurality of V-shaped pits V may be formed on a top surface of the pit forming layer 414. The second superlattice layer 415 may be disposed on the pit forming layer 414 in such a manner that windings generated by the V-shaped pits are maintained, e.g., the second superlattice layer 415 has windings having the same shape as or a shape similar to a shape of the windings generated by the V-shaped pits. In addition, the active layer 416 may be disposed on the second superlattice layer 415 in such a manner that the windings generated by the V-shaped pits are maintained, e.g., the active layer 416 has windings having the same shape as or a shape similar to a shape of the windings generated by the V-shaped pits. The second conductivity-type nitride semiconductor layer 417 may be disposed on the active layer 416 in such a manner that the V-shaped pits are filled.

The nitride semiconductor light emitting device 400 may include first and second electrodes 422 and 424 respectively connected to the first and second conductivity-type nitride semiconductor layers 412 and 417. The first electrode 422 may include a first contact layer 422a and a first contact pad 422b connected to the first contact layer 422a, and the second electrode 424 may include a second contact layer 424a and a second electrode pad 424b connected to the second contact layer 424a.

The nitride semiconductor light emitting device 400 may further include an insulating layer 421 having first and second openings exposing portions of the first and second contact layers 422a and 424a. The first electrode 422 may include the first contact pad 422b connected to the first conductivity-type nitride semiconductor layer 412 through the first opening passing through the second conductivity-type nitride semiconductor layer 417, the active layer 416, the second superlattice layer 415, the pit forming layer 414, and the first superlattice layer 413. The second electrode 424 may include the second electrode pad 424b connected to the second conductivity-type nitride semiconductor layer 417 through the second opening.

Figure 16:
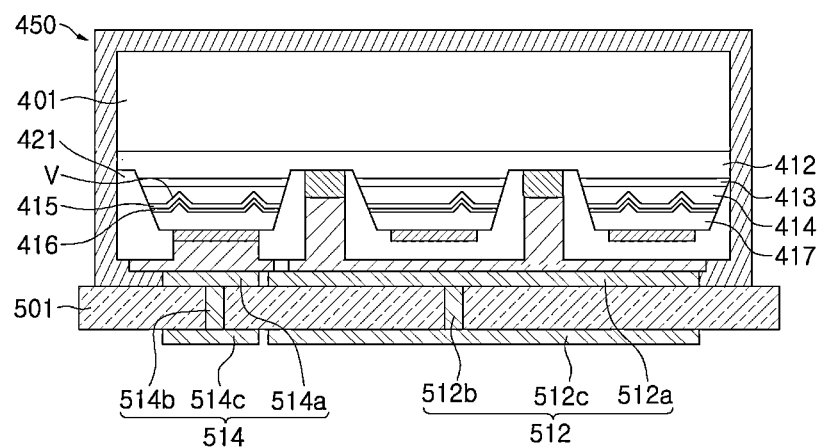
FIG. 16 is a cross-sectional view of a light emitting module including the nitride semiconductor light emitting device illustrated in FIG. 15.

FIG. 16 is a cross-sectional view of a light emitting module including the nitride semiconductor light emitting device illustrated in FIG. 15.

Referring to FIG. 16, a light emitting module 500 according to an exemplary embodiment of the present inventive concept may include a circuit board 501 and a nitride semiconductor light emitting device 400 mounted on the circuit board 501. The nitride semiconductor light emitting device 400 may include the structure described in the aforementioned exemplary embodiments, e.g., the embodiment of FIG. 15.

The circuit board 501 may include first and second electrode structures 512 and 514. The first and second electrode structures 512 and 514 may include first and second upper electrodes 512a and 514a disposed on a top surface of the circuit board 501, and first and second lower electrodes 512c and 514c disposed on a bottom surface of the circuit board 501, and first and second through electrodes 512b and 514b connecting the first and second upper electrodes 512a and 514a and the first and second lower electrodes 512c and 514c. The circuit board 501 adopted in this exemplary embodiment of FIG. 16 is only an example, and may be applied in various forms. For example, the circuit board 501 may be supplied as a printed circuit board (PCB) such as a metal-core PCB (MCPCB), a metal PCB (MPCB), and a flexible PCB (FPCB), a ceramic substrate such as AlN and $Al_2O_3$, or a substrate on which a lead frame is fixed.

The nitride semiconductor light emitting device 400 may be mounted on the circuit board 501 using a flip-chip bonding method. That is, the nitride semiconductor light emitting device 400 may be mounted on the circuit board 501 in such a manner that the first and second electrode pads 422b and 424b (see FIG. 15) face the circuit board 501. The first and second electrode pads 422b and 424b may include a bonding layer, for example, an eutectic metal layer, and may be bonded to the first and second upper electrodes 512a and 514a using the bonding layer. Otherwise, an additional bonding layer, for example, a eutectic metal layer or a conductive epoxy, may be interposed between the first electrode pad 422b the first upper electrode 512a and between the second electrode pad 424b and the second upper electrode 514a.

As illustrated in FIG. 16, a wavelength conversion part 450 converting a wavelength of light emitted from the active layer 416 to another wavelength may be disposed on a surface of the nitride semiconductor light emitting device 400. The wavelength conversion part 450 included in this exemplary embodiment of FIG. 16 may be a resin layer including a wavelength conversion material, such as a fluorescent material or a quantum dot.

The nitride semiconductor light emitting device according to the exemplary embodiments of the present inventive concept may be usefully applied to a variety of applications.

Figure 17:
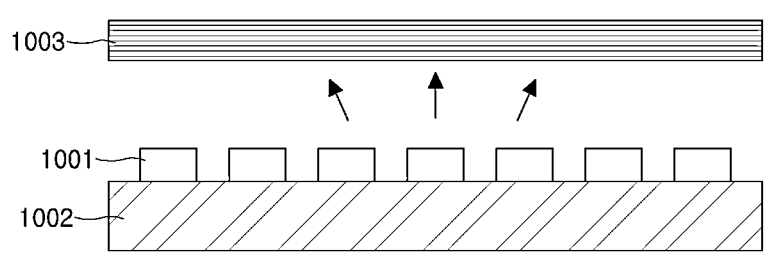
FIGS. 17 and 18 illustrate backlight units including a nitride semiconductor light emitting device (or a light emitting module) according to exemplary embodiments of the present inventive concept.
Figure 18:
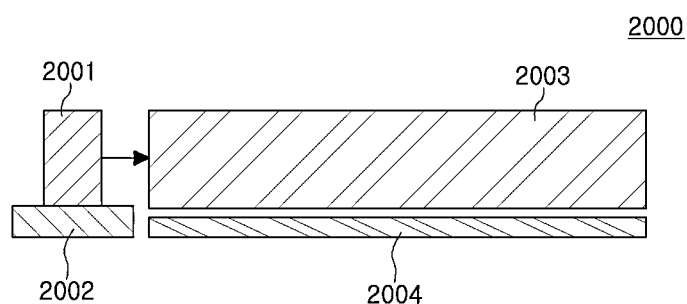

FIGS. 17 and 18 illustrate backlight units including a nitride semiconductor light emitting device according to the exemplary embodiments of the present inventive concept or a light emitting module having the same.

Referring to FIG. 17, a backlight unit 1000 may include a light source 1001 mounted on a substrate 1002, and one or more optical sheet 1003 disposed on the light source 1001. The light source 1001 may include the above-described nitride semiconductor light emitting device (e.g., the nitride semiconductor light emitting device 10, 200, 300 or 400) or light-emitting module (e.g., the light-emitting module 500).

The light source 1001 in the backlight unit 1000 illustrated in FIG. 17 emits light toward a top surface where a liquid crystal display (LCD) is disposed. On the contrary, in another backlight unit 2000 illustrated in FIG. 18, a light source 2001 mounted on a substrate 2002 emits light in a lateral direction, and the emitted light is incident to a light guide plate 2003 and converted to the form of surface light. Light passing through the light guide plate 2003 is emitted upwardly, and a reflective layer 2004 may be disposed on a bottom surface of the light guide plate 2003 to improve light extraction efficiency. The light source 2001 may include the above-described nitride semiconductor light emitting device (e.g., the nitride semiconductor light emitting device 10, 200, 300 or 400) or light-emitting module (e.g., the light-emitting module 500).

Figure 19:
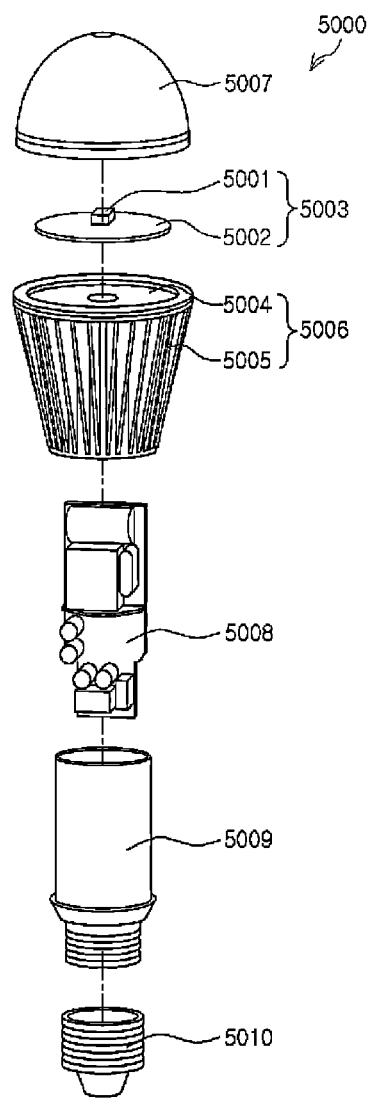
FIG. 19 is an exploded perspective view illustrating an illumination apparatus including a nitride semiconductor light emitting device including a nitride semiconductor light emitting device (or a light emitting module) according to an exemplary embodiment of the present inventive concept.

FIG. 19 is an exploded perspective view illustrating an illumination apparatus including a nitride semiconductor light emitting device according to an exemplary embodiment of the present inventive concept or a light-emitting module having the nitride semiconductor light emitting device.

An illumination apparatus 5000 illustrated in FIG. 19 is a bulb-type lamp for example, and includes a light-emitting module 5003, a driving unit 5008, and an external connection portion 5010.

In addition, external structures, such as external and internal housings 5006 and 5009 and a cover 5007, may be further included. The light-emitting module 5003 may include the above-described nitride semiconductor light emitting device (e.g., the semiconductor light emitting device 10, 200, 300 or 400) or a light source 5001 having the above-described nitride semiconductor light emitting device, and a circuit board 5002 with the light source 5001 mounted thereon. For example, the first and second electrodes of the above-described nitride semiconductor light emitting device may be electrically connected to an electrode pattern of the circuit board 5002. In an exemplary embodiment of the present inventive concept, a single light source 5001 may be mounted on the circuit board 5002, but a plurality of light sources 5001 may be mounted as needed.

The external housing 5006 may function as a heat dissipation unit, and include a heat dissipation plate 5004 in direct contact with the light-emitting module 5003 to enhance a heat dissipation effect, and a heat radiation fin 5005 surrounding a side surface of the illumination apparatus 5000. The cover 5007 may be installed on the light-emitting module 5003, and have a convex lens shape. The driving unit 5008 may be installed in the internal housing 5009 and connected to the external connection portion 5010, such as a socket structure, to receive power from an external power source. In addition, the driving unit 5008 may function to convert the power to an appropriate current source capable of driving the light source 5001 of the light-emitting module 5003. For example, the driving unit 5008 may be configured as an AC-DC converter, a rectifying circuit component, or the like.

Figure 20:
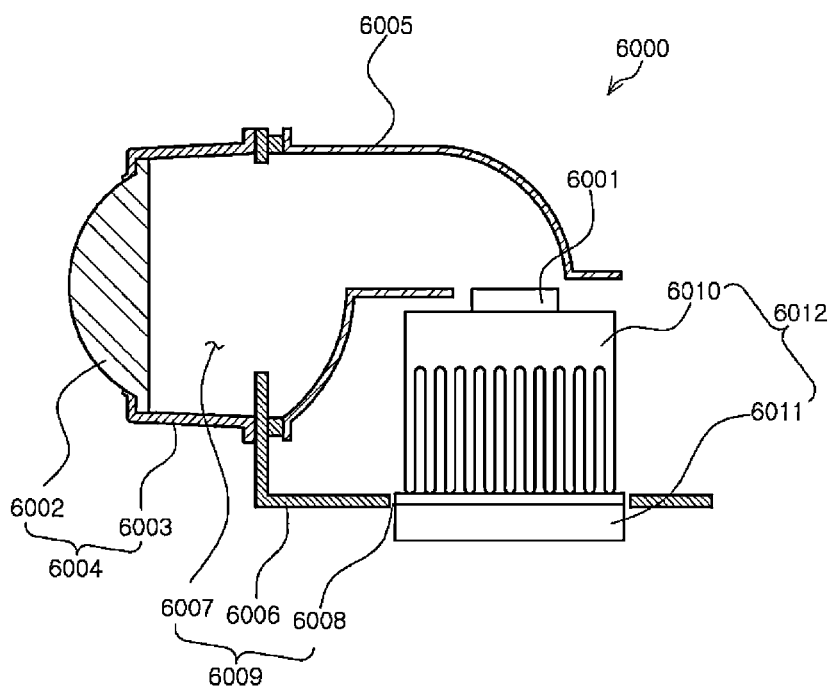
FIG. 20 illustrates a headlamp including a nitride semiconductor light emitting device (or a light emitting module) according to an exemplary embodiment of the present inventive concept.

FIG. 20 illustrates an example in which a nitride semiconductor light emitting device or a light-emitting module including the same according to an exemplary embodiment of the present inventive concept is applied to a headlamp.

Referring to FIG. 20, a headlamp 6000 used as a vehicle lamp, or the like, may include a light source 6001, a reflective unit 6005, and a lens cover unit 6004. The lens cover unit 6004 may include a hollow-type guide 6003 and a lens 6002. The light source 6001 may include the above-described semiconductor light emitting device (e.g., the semiconductor light emitting device 10, 200, 300 or 400) or a package having the semiconductor light emitting device.

The headlamp 6000 may further include a heat dissipation unit 6012 dissipating heat generated by the light source 6001 outwardly. In order to effectively dissipate heat, the heat dissipation unit 6012 may include a heat sink 6010 and a cooling fan 6011. In addition, the headlamp 6000 may further include a housing 6009 fixedly supporting the heat dissipation unit 6012 and the reflective unit 6005, and the housing 6009 may have a body 6006 and a central hole 6008 formed in one surface thereof, to which the heat dissipation unit 6012 is coupled and installed.

The housing 6009 may have a front hole 6007 formed on the other surface integrally connected to the one surface and bent in a right angle direction. The front hole 6007 may allow the reflective unit 6005 to be fixedly positioned above the light source 6001. Accordingly, a front side may be opened by the reflective unit 6005, and the reflective unit 6005 may be fixed to the housing 6009 such that the opened front side corresponds to the front hole 6007, and light reflected by the reflective unit 6005 may pass through the front hole 6007 so as to be emitted outwardly.

According to the exemplary embodiments of the present inventive concept, stress applied to an active layer can be effectively released and current spreading effect can be improved by introducing a first superlattice layer located below a V-shaped pit forming layer, and a second superlattice layer disposed on the V-shaped pits.

Accordingly, a nitride semiconductor light emitting device having improved electrical characteristics can be provided.

While exemplary embodiments have been shown and described above, it will be apparent to those skilled in the art that modifications and variations could be made without departing from the spirit and scope of the present disclosure as defined by the appended claims.

What is claimed is:

1. A nitride semiconductor light emitting device, comprising:
    a first conductivity-type nitride semiconductor layer;
    a first superlattice layer disposed on the first conductivity-type nitride semiconductor layer;
    a pit forming layer disposed on the first superlattice layer and having a plurality of V-shaped pits;
    a second superlattice layer disposed on the pit forming layer and having windings that have the same shape as a shape of windings generated by the V-shaped pits;
    an active layer disposed on the second superlattice layer and having windings that have the same shape as the shape of the windings generated by the V-shaped pits; and
    a second conductivity-type nitride semiconductor layer disposed on the active layer, and filling the V-shaped pits.

2. The nitride semiconductor light emitting device of claim 1, wherein the pit forming layer includes a first conductivity-type nitride semiconductor.

3. The nitride semiconductor light emitting device of claim 2, wherein the first conductivity-type nitride semiconductor layer has a first impurity concentration, and the pit forming layer has a second impurity concentration lower than the first impurity concentration.

4. The nitride semiconductor light emitting device of claim 3, wherein the first impurity concentration is $2 \times 10^{18}/cm^3$ or more, and the second impurity concentration is $1 \times 10^{18}/cm^3$ or less.

5. The nitride semiconductor light emitting device of claim 1, wherein the pit forming layer has a thickness of at least 0.1 µm.

6. The nitride semiconductor light emitting device of claim 1, wherein a lower portion of the pit forming layer under the V-shaped pit has a thickness less than or equal to 1/5 of a thickness of the pit forming layer.

7. The nitride semiconductor light emitting device of claim 1, wherein the first conductivity-type nitride semiconductor layer includes a plurality of dislocations, and the V-shaped pits are defined in portions corresponding to the dislocations.

8. The nitride semiconductor light emitting device of claim 1, wherein:
    each of the first and second superlattice layers comprises first and second nitride layers having different compositions and alternately stacked, and
    the first and second nitride layers are $Al_xIn_yGa_{1-x-y}N$ ($0 \leq x \leq 1$, $0 \leq y \leq 1$ and $0 \leq x+y \leq 1$) having different compositions.

9. The nitride semiconductor light emitting device of claim 8, wherein one of the first and second nitride layers is GaN, and the other of the first and second nitride layers is $Al_xGa_{1-x}N$ ($0 < x \leq 1$) or $In_yGa_{1-y}N$ ($0 < y \leq 1$).

10. The nitride semiconductor light emitting device of claim 9, wherein the first and second nitride layers of the first superlattice layer are nitride semiconductor materials having the same compositions as the first and second nitride layers of the second superlattice layer, respectively.

11. The nitride semiconductor light emitting device of claim 8, wherein the second superlattice layer has five pairs of the first and second nitride layers or less.

12. The nitride semiconductor light emitting device of claim 1, wherein at least one of the first and second superlattice layers comprises AlGaN, GaN, and InGaN such that AlGaN, GaN, and InGaN are repeatedly stacked.

13. The nitride semiconductor light emitting device of claim 1, wherein:
    the active layer comprises a plurality of quantum well layers and a plurality of quantum barrier layers alternately stacked, and
    the second superlattice layer comprises a plurality of first nitride layers and a plurality of second nitride layers alternately stacked, and
    the first and second nitride layers are nitride semiconductor materials having the same compositions as the quantum well layer and the quantum barrier layer, respectively.

14. The nitride semiconductor light emitting device of claim 13, wherein the first nitride layer has a thickness smaller than a thickness of the quantum well layer.

15. The nitride semiconductor light emitting device of claim 1, wherein the second conductivity-type nitride semiconductor layer includes a planarization layer filling the V-shaped pits and doped with second conductivity-type impurities, and a second conductivity-type contact layer disposed on the planarization layer.

16. The nitride semiconductor light emitting device of claim 15, wherein:
    the planarization layer includes an AlGaN layer doped with second conductivity-type impurities, and
    the second conductivity-type contact layer includes a GaN layer doped with further second conductivity-type impurities.

17. The nitride semiconductor light emitting device of claim 15, wherein:
    the planarization layer includes a superlattice layer formed of AlGaN and GaN doped with second conductivity-type impurities, and
    the second conductivity-type contact layer includes a GaN layer doped with further second conductivity-type impurities.

18. The nitride semiconductor light emitting device of claim 1, wherein the V-shaped pit has an inclined (1-101) surface.

19. A light emitting module, comprising:
    a circuit board including a first electrode structure and a second electrode structure; and
    the nitride semiconductor light emitting device of claim 1 disposed on the circuit board,
    wherein the first and second electrodes of the nitride semiconductor light emitting device are respectively connected to the first and second electrode structures.

20. An illuminating apparatus, comprising:
a light emitting module including the nitride semiconductor light emitting device of claim 1;
a driving unit configured to drive the light emitting module; and
an external connection unit configured to supply an external voltage to the driving unit.

\* \* \* \* \*

UNITED STATES PATENT AND TRADEMARK OFFICE
CERTIFICATE OF CORRECTION

PATENT NO. : 9,112,105 B1  
APPLICATION NO. : 14/540969  
DATED : August 18, 2015  
INVENTOR(S) : Yang et al.

Page 1 of 1

It is certified that error appears in the above-identified patent and that said Letters Patent is hereby corrected as shown below:

On the title page item [72] should read:  
Jung Seung Yang, Seongnam-si (KR); Seong Joon Cho, Osan-si (KR); Bum Joon Kim, Seoul (KR); Yung Wook Shim, Suwon-si (KR); Suk Ho Yoon, Seoul (KR)

Signed and Sealed this  
Tenth Day of May, 2016

Michelle K. Lee  
*Director of the United States Patent and Trademark Office*